United States Patent [19]

Liang

[11] Patent Number: 5,350,713
[45] Date of Patent: Sep. 27, 1994

[54] DESIGN AND SEALING METHOD FOR SEMICONDUCTOR PACKAGES

[75] Inventor: Louis H. Liang, Los Altos, Calif.

[73] Assignee: VLSI Technology, Inc., San Jose, Calif.

[21] Appl. No.: 943,260

[22] Filed: Sep. 10, 1992

Related U.S. Application Data

[63] Continuation-in-part of Ser. No. 630,113, Dec. 19, 1990, Pat. No. 5,218,215, and a continuation-in-part of Ser. No. 900,137, Jun. 18, 1992, abandoned.

[51] Int. Cl.5 .......................................... H01L 21/60
[52] U.S. Cl. ................................... 437/217; 437/209; 437/214; 437/215; 437/218
[58] Field of Search ............... 437/209, 210, 211, 212, 437/213, 214, 215, 216, 217, 218, 219, 220

[56] References Cited

U.S. PATENT DOCUMENTS

| | | | |
|---|---|---|---|
| 4,355,463 | 10/1982 | Burns | 437/217 |
| 4,618,739 | 10/1986 | Theobald . | |
| 4,651,415 | 3/1987 | Frampton . | |
| 4,908,086 | 3/1990 | Goodrich et al. | 437/218 |
| 4,978,638 | 12/1990 | Buller et al. | 437/209 |
| 5,014,418 | 5/1991 | Wright | 437/217 |
| 5,059,558 | 10/1991 | Tatsanakit et al. | 437/218 |
| 5,073,521 | 12/1991 | Braden | 437/217 |
| 5,106,785 | 4/1992 | Rauchmaul et al. | 437/217 |
| 5,194,695 | 3/1993 | Maslakow | 437/216 |

Primary Examiner—Tom Thomas
Assistant Examiner—Kevin M. Picardat
Attorney, Agent, or Firm—Majestic, Parsons, Siebert & Hsue

[57] ABSTRACT

Several methods of forming an integrated circuit package by ultrasonically welding a thermal plastic material which joins two housing portions together in such a fashion as to seal an integrated circuit within the two housing portions is described along with the resulting structures of those methods.

20 Claims, 6 Drawing Sheets

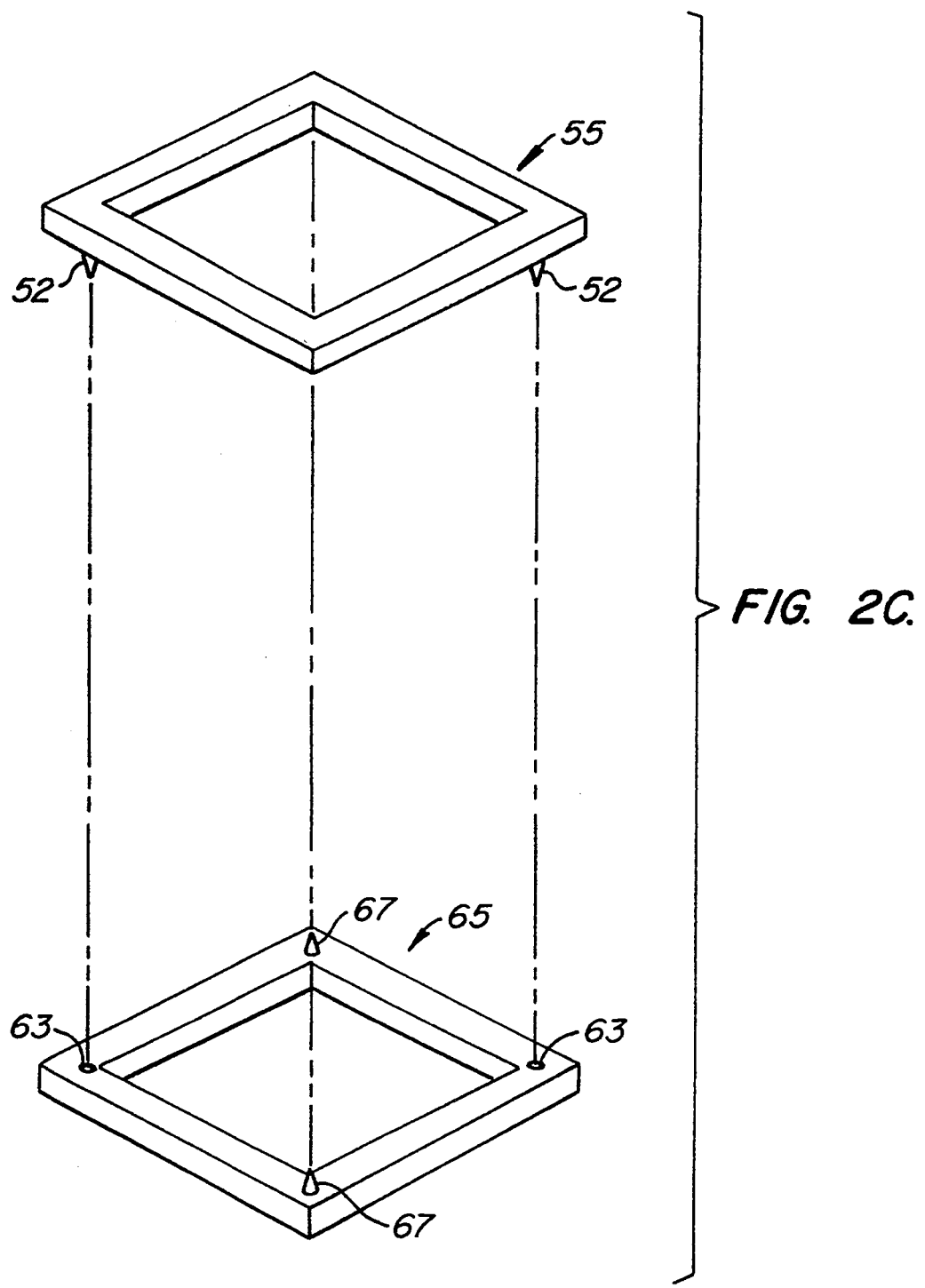

DESIGN AND SEALING METHOD FOR SEMICONDUCTOR PACKAGES

CROSS REFERENCE TO RELATED APPLICATIONS

This is a continuation-in-part to U.S. patent application Ser. No. 630,113, U.S. Pat. No. 5,218,215 entitled "Semiconductor Device Package with Improved Heat Dissipation Characteristics," filed on Dec. 19, 1990, and its progeny, U.S. patent application Ser. No. 900,137, abandoned entitled "Method of Packaging a Semiconductor Device in a Package with Improved Heat Dissipation Characteristics," filed on Jun. 18, 1992; both applications filed by Jon Long and Louis Liang, and assigned to the same assignee as the present invention.

BACKGROUND OF THE INVENTION

This invention relates in general to semiconductor packages and packaging techniques and in particular, to semiconductor packages suitable for housing high density integrated circuits ("ICs") having large input-output ("I/O") connection requirements, and high volume production methods for assemblying those packages.

Current methods for packaging high density ICs having large I/O connection requirements are generally unsuitable for volume manufacturing. For example, numerous methods are used for sealing a lid over a high density IC in a high-performance, plastic pin-grid-array ("HP-PPGA") package. One method attaches a ceramic or metal lid to a package body by utilizing an epoxy seal ring. After the lid, seal ring, and package body are carefully aligned and clamped together, the entire structure is then placed in an oven at 100°-225° C. for 30- 90 minutes, depending upon the epoxy used. In this method, outgassing of the epoxy during the curing period has been a major problem and consequently, a sealing dam is typically needed in the package to match the seal ring. Other methods include placing a ceramic or metal lid with a flange over the package body, and back filling the package with liquid epoxy to effect the sealing upon curing of the structure; placing a ceramic or metal lid with a flat flange inside a dam ring of the package body, and covering the flange with liquid epoxy to effect the sealing upon curing; and placing a lid on top of the package body with some adhesive material, placing the entire structure in a cavity mold, and transfer molding the enclosed structure with epoxy.

In addition to HP-PPGA packages, other techniques for packaging high density ICs having large I/O connection requirements include cavity quad-flat-pack packages, also known as "clam shell" packages. These packages are typically made of either metal or plastic, containing two halves. A lead frame is either attached to one of the package halves or molded into the other. The two halves are then brought together and "glued" together. The "glue" typically used for this purpose is a thermal set epoxy which requires a long curing period of 30-90 minutes, depending upon the epoxy used. In this method, outgassing of the epoxy during the curing period has been a major problem and consequently, a vent hole in one of the package halves is often needed. In addition, proper alignment of the two package halves and the lead frame sandwiched in between them, can pose additional manufacturing problems.

Automated manufacturing of both the HP-PPGA and "clam shell" type of packages is difficult, because both require an oven bake and long, 30 to 90 minute curing time for their thermal set epoxy sealing materials to set. Further, both types of packages also experience outgassing problems during the epoxy bake.

In addition to being generally unsuitable for volume manufacturing, current methods for packaging high density ICs having large I/O connection requirements are also generally unsuitable for disassembly and subsequent reassembly of the packages. Disassembly or "decapping" of plastic packages is frequently desired for failure analysis purposes. It is especially desirable where a significant set of common failures are detected that can be remedied by incorporating corrective actions in the manufacturing process. For example, "open" circuits on leads may be caused by bonding wires pulling away from their contact points on either the bond pads on the semiconductor die or attachment points on the package leads. In either case, better bonding techniques might be employed to correct the problem. Also, "short" circuits between leads may be caused by adjacent bonding wires touching. In such a case, re-layout of the bond pad patterns on the semiconductor die may eliminate the problem by spacing further apart, the bond pads corresponding to the two touching bonding wires.

Reassembly of a disassembled plastic package would also be desirable if the originally failed part could be reworked and made functional. Referring back to the previous examples, if the "open" leads can be corrected by rebonding the bonding wires to their attachment points, then the reworked part would be functional and reassembly of the reworked part would be desirable. Also, if the "short" circuits between leads can be corrected by simply spreading the touching bonding wires apart, then the reworked part would be functional and reassembly of the reworked part would be desirable.

In the past, the cost of disassembling, reworking and reassemblying failed parts when compared to the ultimate selling price of those parts, made such reworking activity commercially impractical. Today, however, such reworking activity is commercially practical in certain situations, and certain technology trends which are leading to costlier packaged parts, indicate that the number of such situations will grow in the future. Included among these trends, several of which are interrelated, are larger semiconductor die both in terms of physical size and number of transistors, increased number of input/output connections between the die and external package leads, more complex and expensive packaging techniques and materials, and increased usage of multichip modules to enhance circuit performance by combining multiple chips in one package to reduce transmission delay times between chips and to allow different portions of the circuit to be partitioned into different chips so that those portions can be fabricated by the optimal process technology suitable for the functional purpose of that portion of the circuit.

OBJECTS AND SUMMARY OF THE INVENTION

Accordingly, one object of the present invention is to provide a semiconductor package for housing high density ICs having large I/O connection requirements, which is easy to assemble, disassemble and reassemble.

Another object is to provide a packaging method for packaging high density ICs having large I/O connection requirements, which facilitates automation.

Another object is to provide a packaging method for packaging high density ICs having large I/O connection requirements, which eliminates epoxy outgassing problems.

Another object is to provide a packaging method for packaging high density ICs having large I/O connection requirements, which reduces mechanical alignment problems between a lead frame and the package during the packaging process.

These and additional objects are accomplished by the various aspects of the present invention, wherein briefly stated, one aspect of the invention accomplishes one or more of these objects by an integrated circuit package comprising two housing portions which are joined together by a seal ring which is mated with grooves formed on each of the two housing portions.

Another aspect of the invention is an integrated circuit package comprising two housing portions which are joined together by a protrusion mated with a groove, wherein the protrusion is formed on one of the housing portions and the groove is formed on the other.

Another aspect of the invention is an integrated circuit package comprising two housing portions which are joined together at abutting surfaces, wherein the abutting surface of one of the housing portions includes a coating of graphite particles and the abutting surface of the other housing portion includes a thermal plastic material.

Another aspect of the invention is an integrated circuit package comprising two housing portions which are joined together at abutting surfaces, wherein one of the housing portions comprises a thermal plastic material and at least a portion of the abutting surface of the other housing portion comprises a thermal plastic material.

Another aspect of the invention is an integrated circuit package comprising two housing portions, and a lead frame sandwiched in-between the two, wherein each of at least two pins is inserted into both an alignment hole formed in the lead frame and an alignment hole formed in one of the housing portions.

Another aspect of the invention is a method for packaging an integrated circuit comprising the steps of (a) forming two housing portions adapted to be joined together to house an integrated circuit, wherein each housing portion has a thermal plastic joint area formed on it which is adjacent to that of the other housing portion when the two housing portions are joined together, and the thermal plastic joint area of at least one of the housing portions is formed by forming a groove having serrated walls in that housing portion and insert molding a thermal plastic material into that groove, and (b) bringing the two housing portions together and joining them together by ultrasonically welding together the two thermal plastic joint areas.

Another aspect of the invention is a method for packaging an integrated circuit comprising the steps of (a) forming two housing portions adapted to be joined together to house an integrated circuit, wherein each housing portion has a thermal plastic joint area formed on it which is adjacent to that of the other housing portion when the two housing portions are joined together, and the thermal plastic joint area of at least one of the housing portions is formed by press-fitting a seal ring comprising a thermal plastic material into a groove formed in that housing portion, and (b) bringing the two housing portions together and joining them together by ultrasonically welding together the two thermal plastic joint areas.

Another aspect of the invention is a method for packaging an integrated circuit comprising the steps of (a) forming two housing portions adapted to be joined together to house an integrated circuit, wherein each housing portion has a thermal plastic joint area formed on it which is adjacent to that of the other housing portion when the two housing portions are joined together, and one of the two housing portions has at least two alignment holes formed on it, (b) forming a lead frame having at least two alignment holes, (c) positioning and holding the lead frame against the housing portion having at least two alignment holes such that each of the at least two alignment holes of the lead frame is adjacent to one of the at least two alignment holes of the housing portion, (d) bringing the two housing portions together so the lead frame is sandwiched in-between the two, and (e) joining the two housing portions together by ultrasonically welding together the thermal plastic joint areas of the two housing portions.

Another aspect of the invention is a method for packaging an integrated circuit comprising the steps of (a) forming two housing portions adapted to be joined together to house an integrated circuit, wherein one of the two housing portions has at least two alignment holes, (b) forming a lead frame having at least two alignment holes, (c) positioning and holding the lead frame against the housing portion having at least two alignment holes such that each of the at least two alignment holes of the lead frame is adjacent to one of the at least two alignment holes of the housing portion having at least two alignment holes, and (d) bringing the two housing portions together so that the lead frame is sandwiched in-between the two, and joining the two housing portions together.

Additional objects, features and advantages of the various aspects of the present invention will become apparent from the following description of its preferred embodiment, which description should be taken in conjunction with the accompanying drawings.

BRIEF DESCRIPTION OF THE DRAWINGS

FIG. 2C illustrates, as an example, an alternative seal ring configuration, utilizing aspects of the present invention, which is suitable for use in the "clam shell" type of package illustrated in FIG. 2B.

DESCRIPTION OF THE PREFERRED EMBODIMENT

FIGS. 1A-F illustrate, as examples, exploded, perspective views of alternative thermal plastic joint areas (i.e., the areas where two housing portions come together and are joined), utilizing aspects of the present invention. In particular, they illustrate alternative methods and their resulting structures, for joining together and sealing two housing portions of an integrated circuit ("IC") package by first forming a thermal plastic joint area on each of the two housing portions, then bringing the two housing portions together and joining them together by ultrasonically welding their respective thermal plastic joint areas together.

A thermal plastic material is preferred for the joint areas for several reasons. First, it ultrasonically welds well and ultrasonic welding is the preferred welding technique. Not only is ultrasonic welding considerably faster than oven curing for joining two housing portions together to form an IC package, the machines used for ultrasonic welding are cheaper, more compact, and more suitable for automated assembly lines than large curing ovens. For example, automated production of the packaging process can readily be accomplished by using a turn table with multiple nest and part placement stations, upon which the parts to be packaged are placed, in conjunction with a commercially available ultrasonic welder adapted with a suitable horn for directing the ultrasonic heating.

Another reason why thermal plastic is the preferred material, is that it can easily and repeatedly be melted, molded and rehardened again by cooling. In contrast, once a thermal set epoxy sets, it generally can not be readily remelted without exposing the packaged IC to excessively high temperatures. Consequently, thermal plastic material not only facilitates easy assembly, but also disassembly, and under certain conditions, reassembly of the packaged unit.

In addition, being a resilient material, the use of thermal plastic reduces the likelihood of occurrence of any joint area failures due to thermal coefficient expansion ("TCE") mismatch which may result from extreme temperature cycling; and it eliminates the outgassing problem associated with thermal set epoxy sealing techniques.

In FIGS. 1A–F, only the thermal plastic joint areas are shown, not the entire housing portions. This is because the aspects of the present invention illustrated by the examples shown in FIGS. 1A–F, are not dependent upon the size or shape of the two housing portions. For example, the two housing portions can be in the form of two "clam shells" which are brought together and joined, or one of the housing portions can be a lid which caps an IC attached to a substrate acting as the other housing portion.

Figure 1A:
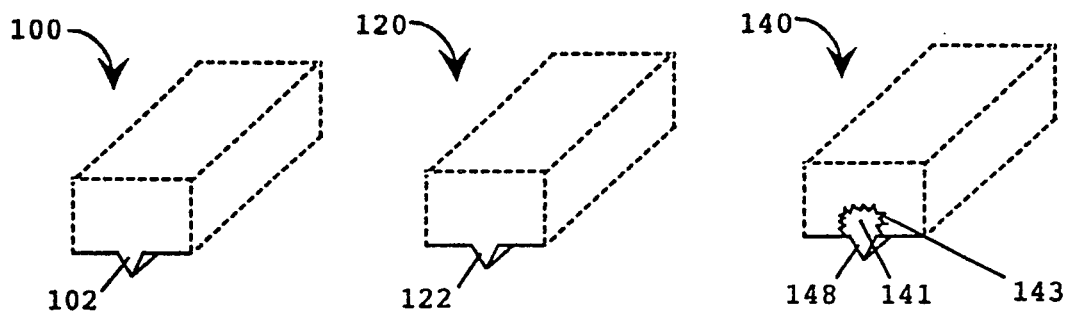
FIGS. 1A-F illustrate, as examples, exploded, perspective views of alternative thermal plastic joint areas, utilizing aspects of the present invention.

FIG. 1A illustrates the simplest type of thermal plastic joint area. In this example, both housing portions ·comprise a thermal plastic material. A groove 116 is formed on a thermal plastic joint area 114 of one of the two housing portions, and a weld projection 102 is formed on a thermal plastic joint area 100 of the other housing portion. After bringing the two housing portions together, their respective thermal plastic joint areas, 100 and 114, are aligned adjacent to the other by fitting the weld projection 102 of one into the groove 116 of the other. Thereafter, the two thermal plastic joint areas, 100 and 114, are joined together by ultrasonically welding them together.

Although FIG. 1A illustrates the simplest example of forming a thermal plastic joint area, it may not always be desirable to have both housing portions comprised of thermal plastic material. For example, thermal plastic material may not be as durable as other materials when exposed to high temperature conditions.

Figure 1B:
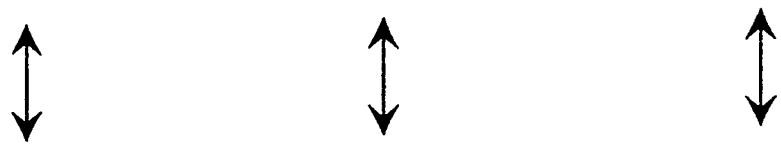

FIG. 1B illustrates a method and resulting structure, for joining two sections, 120 and 134, of two housing portions together, wherein one of the sections 134 does not comprise a thermal plastic material. In this example, a thermal plastic joint area is first formed on section 134 by press-fitting or forming a protrusion 132 of a thermal plastic seal ring 130 into a groove 136 which has been preformed in the section 134. The protrusion 132 of the thermal plastic seal ring 130 thus press-fitted or formed within the groove 136, mechanically interlocks with the groove 136, because of the corresponding shapes of the protrusion 132 and the groove 136.

Thereafter, the two sections, 120 and 134, are joined by bringing them together and ultrasonically welding the thermal plastic section 120 to the thermal plastic seal ring 130. To facilate ultrasonic welding, a weld projection 122 is formed on the thermal plastic section 120. The weld projection, could also have been just as readily and satisfactorily been formed on the flat surface of the seal ring 130 (e.g., as shown on seal ring 170 in FIG. 1D).

In the remaining examples, as illustrated in FIGS. 1C–F, neither of the two housing portions comprises a thermal plastic material. Consequently, a thermal plastic joint area is formed on both sections of both housing portions in these examples.

Figure 1C:
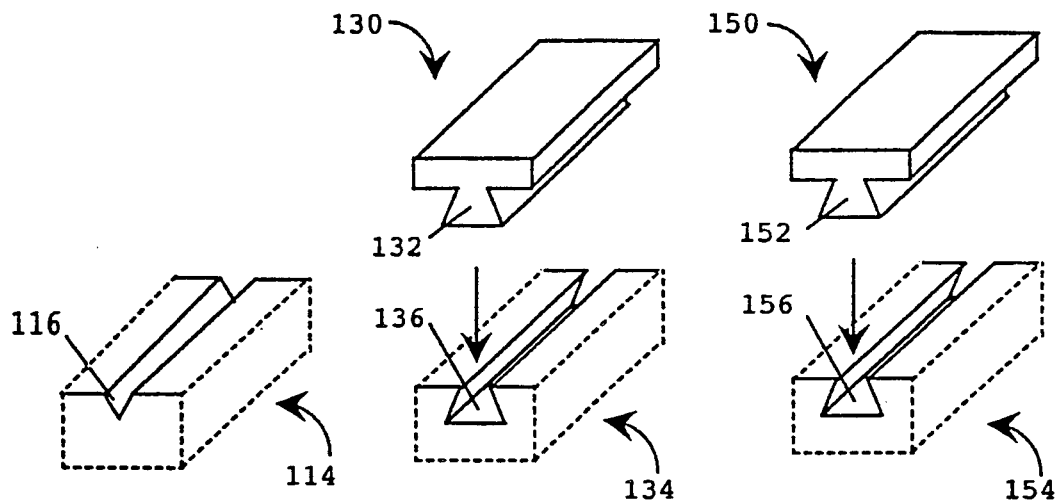

In FIG. 1C, a thermal plastic joint area is formed on section 154 in the same manner as that formed on section 134 in FIG. 1B. A protrusion 152 of a thermal plastic seal ring 150 is press-fitted or otherwise formed into a groove 156 which has been preformed in the section 154, and as a result, the protrusion 152 mechanically interlocks with the groove 156.

A different technique is used in forming the thermal plastic joint area on section 140. In this preferred method and resulting structure, thermal plastic material 141 is insert molded into a groove 143 having serrated walls, which has been preformed in section 140. The serrated walls act as many mechanical fingers to "grip" the insert molded thermal plastic material 141.

Thereafter, the two sections, 140 and 154, are joined by bringing them together and ultrasonically welding the thermal plastic material 141 of section 140 to the thermal plastic seal ring 150. To facilate ultrasonic welding, the molding process used in forming the thermal plastic material 141 also forms a projection weld 148 on the insert molded thermal plastic material 141. Although this is the preferred method of forming the projection weld, the weld projection could also have been formed on the flat surface of the seal ring 150.

Figures 1D, 1E, 1F:
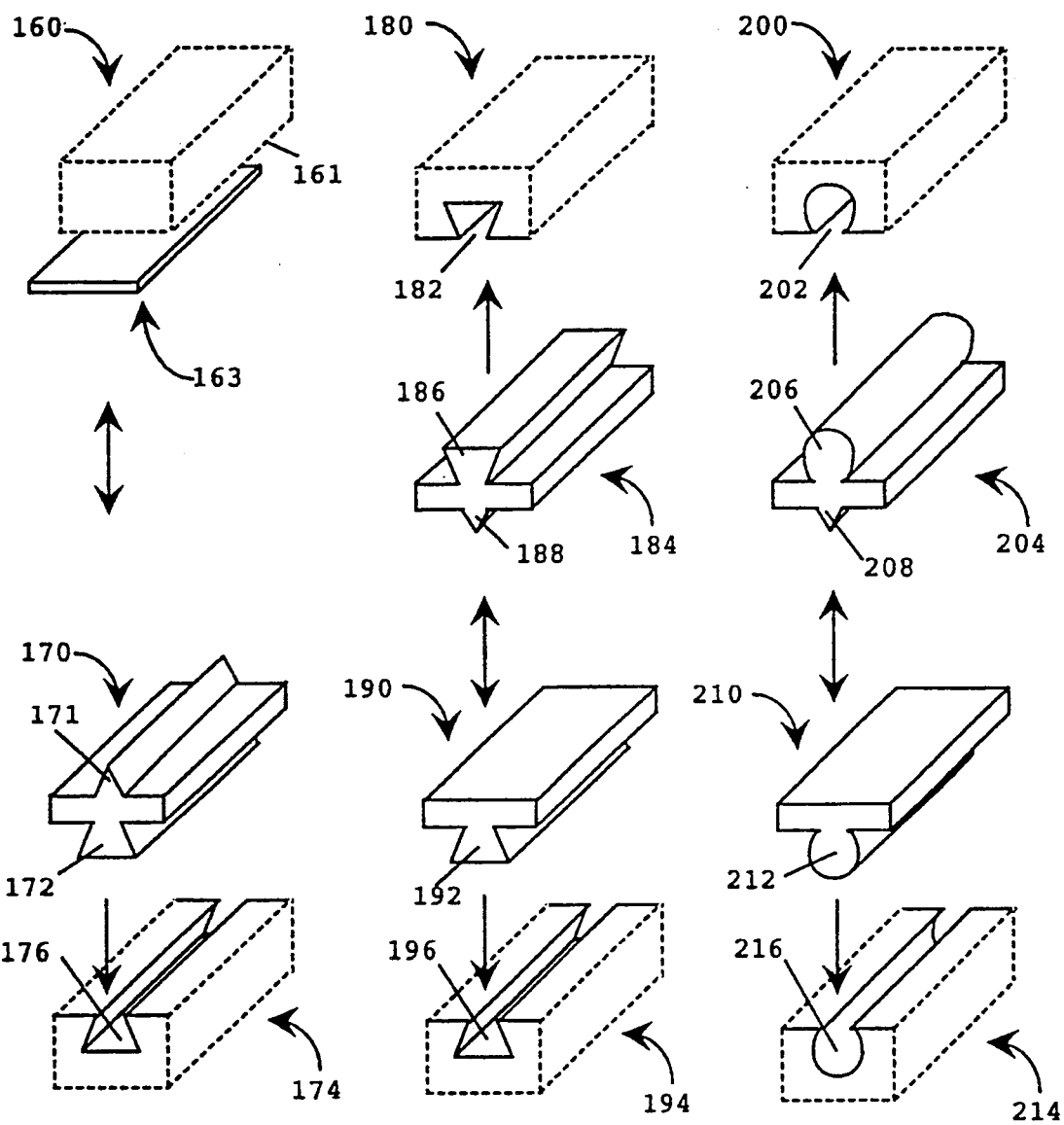

FIG. 1D illustrates a method and resulting structure for joining two sections, 160 and 174, of two housing portions together, wherein a thermal plastic joint area is formed on only one of the two housing portions. In this example, a thermal plastic joint area is formed on section 174 in the same manner as that formed on section 134 in FIG. 1B. A protrusion 172 of a thermal plastic seal ring 170 is press-fitted or otherwise formed into a groove 176 which has been preformed in the section 174, and as a result, the protrusion 172 mechanically interlocks with the groove 176. A weld projection 171 to facilitate ultrasonic welding, is formed in this case on the seal ring 170. In addition to the method of forming the thermal plastic joint area as thus described, the thermal plastic joint area could also have been formed on section 174 in the same manner as that formed on section 140 in FIG. 1C.

A coating of graphite particles 163 is formed on surface 161 of the section 160, instead of forming a thermal plastic joint area on the section. In order to properly hold the coating of graphite particles 163, the material comprising section 160 is preferably a metallic or ceramic material.

Thereafter, the two sections, 160 and 174, are joined by bringing them together and ultrasonically welding the thermal plastic seal ring 170 to the coating of graphite particles 163. The coating of graphite particles 163 acts in this case as a rough or serrated surface which mechanically interlocks with the melted and rehardened thermal plastic material of the projection weld 171 of the seal ring 170. For maximum bonding strength, a coating of graphite particles 163 on a flat surface 161 is preferable. However, if desired, a shallow groove may be formed on section 160 for alignment or registration purposes in the same manner as illustrated by groove 116 in FIG. 1A.

Although not illustrated, it is also contemplated that not just section 160, but both sections 160 and 174 may have a coating of graphic particles formed on it. In this situation, a groove would not have to be formed on the section 174 and a protrusion would not have to be formed on the seal ring 170. A weld projection, however, preferably would be formed on both sides of the seal ring 170. The two sections, 160 and 174, would then be joined by bringing them together with the thermal plastic seal ring 170 properly positioned in-between the two, and ultrasonically welding the thermal plastic seal ring 170 to both the coating of graphite particles formed on section 160 and the coating formed on section 174.

FIGS. 1E and 1F illustrate, as examples, still another method and resulting structure, for forming two thermal plastic joint areas on two sections of two housing portions. Thermal plastic joint areas are formed on sections 180 and 194 in FIG. 1E, and sections 200 and 214 in FIG. 1F, in the same manner as that formed on section 134 in FIG. 1B. For example, in FIG. 1E, a protrusion 192 of a thermal plastic seal ring 190 is press-fitted or otherwise formed into a groove 196 which has been preformed in the section 194, and as a result, the protrusion 192 mechanically interlocks with the groove 196 to form a thermal plastic joint area on section 194. Similarly, a protrusion 186 of a thermal plastic seal ring 184 is press-fitted or otherwise formed into a groove 182 which has been preformed in the section 180, and as a result, the protrusion 186 mechanically interlocks with the groove 182 to form a thermal plastic joint area on section 180.

Thereafter, the two sections, 180 and 194, are joined by bringing them together and ultrasonically welding the two thermal plastic seal rings 184 and 190 together. To facilate ultrasonic welding, a projection weld is preferably formed on one of the two seal rings. In this example, a weld projection 188 is formed on seal ring 184. During the ultrasonic welding process, the weld projection 188 is melted and the melted thermal plastic material of the weld projection 188 flows across the abutting surfaces of the two seal rings, 184 and 190, to provide an enhanced bond between the two seal rings, 184 and 190, as well as a hermetic seal between the two sections, 180 and 194.

FIG. 1F illustrates another example similar to that of FIG. 1E. The only difference between the two examples is the shape of the grooves, e.g., 182 and 202 for comparison, and the corresponding shapes of the protrusions, e.g., 186 and 206, of the thermal plastic seal rings, e.g., 184 and 204. These shapes are shown for illustrative purposes only, and are not intended to limit the scope of this or other aspects of the current invention, as other groove shapes can also readily be envisioned which facilitate mechanical interlocking between a groove formed in a section of a portion of a housing and a corresponding protrusion formed on a thermal plastic seal ring.

Figure 2A:
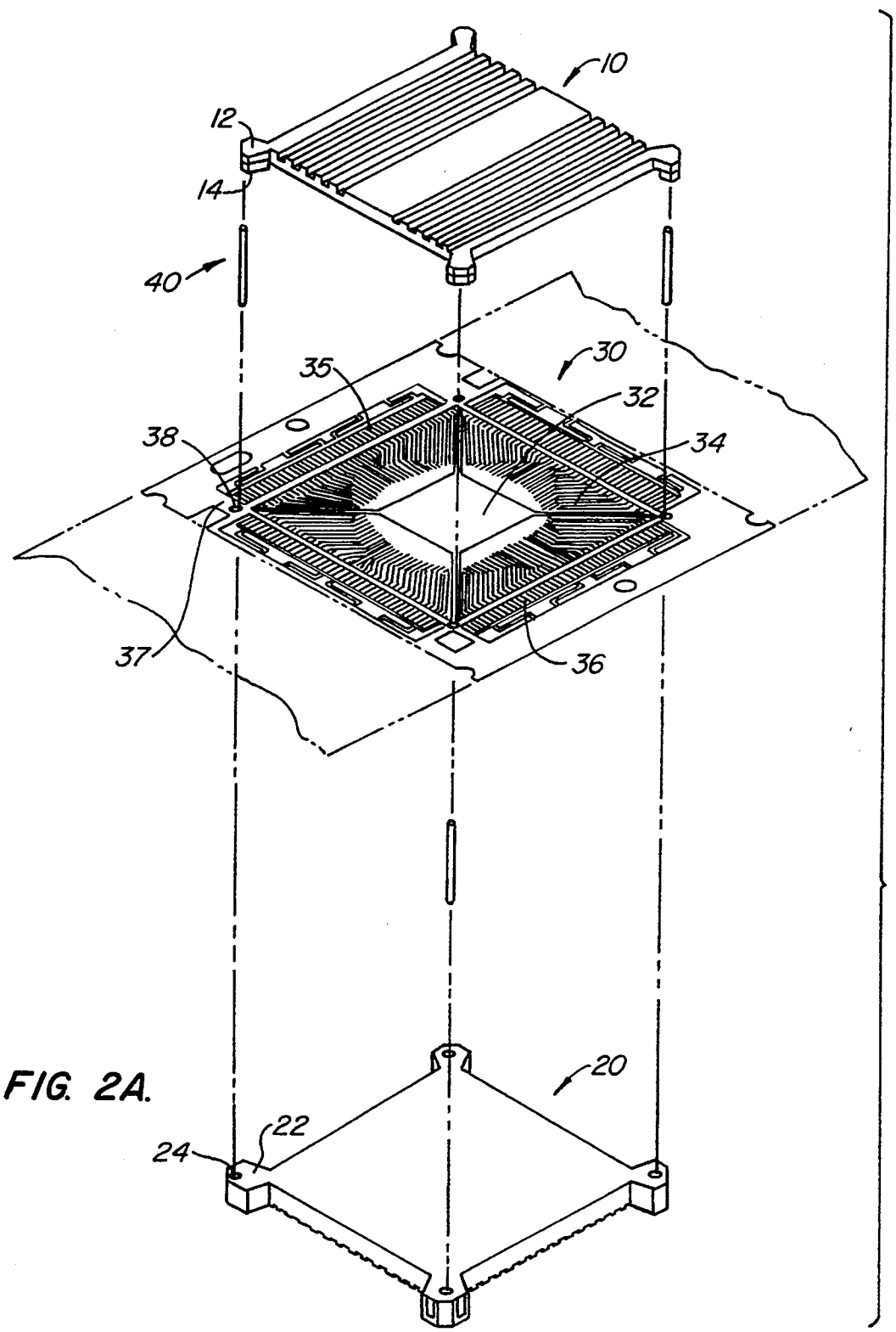
FIGS. 2A-B illustrate, as examples, exploded, perspective views of two different "clam shell" type packages, utilizing aspects of the present invention.
Figure 2B:
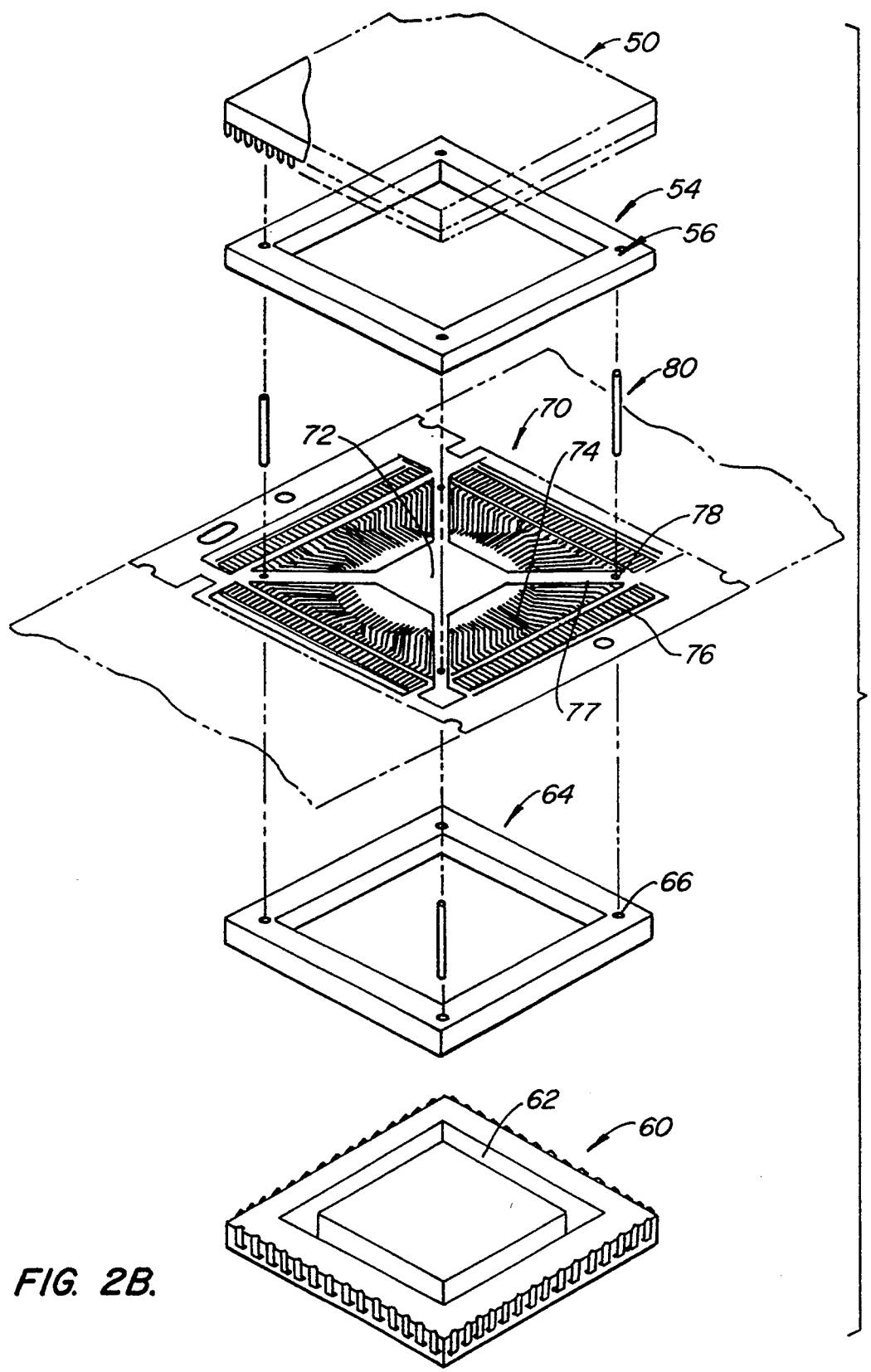

FIGS. 2A–B illustrate exploded, perspective views of two "clam shell" type packages, utilizing these and other aspects of the current invention. Referring first to FIG. 2A, a lead frame 30 is first positioned against and aligned with a "clam shell" housing portion 20, then a second "clam shell" housing portion 10 is positioned against the opposite side of the lead frame 30 and the two "clam shell" housing portions, 20 and 10, are then joined together with the lead frame 30 sandwiched in-between. Proper alignment of the lead frame 30 with respect to both of the housing portions, 20 and 10, is important, because if alignment is incorrect, leads extending out of the assembled package (e.g., leads 35 and 36 of the lead frame 30) will not be of equal length across opposite sides of the package and as a result, the assembled package will not subsequently mount properly on a printed circuit board.

Alignment of the lead frame 30 with respect to the "clam shell" housing portion 20 is achieved by aligning each alignment hole formed on the lead frame 30 with a corresponding alignment hole formed on the "clam shell" housing portion 20 (e.g., alignment hole 38 of the lead frame 30 and alignment hole 24 of the "clam shell" housing portion 20). After each of the alignment holes formed on the lead frame 30 has been aligned with its corresponding alignment hole on the "clam shell" housing portion 20, a pin is inserted in each alignment hole pair (e.g., pin 40 into alignment hole 38 of the lead frame 30 and alignment hole 24 of the "clam shell" housing portion 20) to hold the lead frame 30 in its now aligned position.

Thereupon, the second "clam shell" housing portion 10 is positioned against the opposite side of the lead frame 30, then aligned with the first "clam shell" housing portion 20, and then joined in some manner with the first "clam shell" housing portion 20. Preferably, alignment of the two "clam shell" housing portions, 10 and 20, is accomplished by aligning and inserting each pin extending out of the previously aligned alignment hole pair of the lead frame 30 and the first "clam shell" housing portion 20, with an alignment hole formed in the second "clam shell" housing portion 10 (e.g., alignment hole 14 formed in "clam shell" housing portion 10 is aligned with pin 40 and pin 40 is inserted therein).

In this example, the alignment holes formed in the "clam shell" housing portions, 20 and 10, are formed in "bumpers" on each of the "clam shell" housing portions (e.g., alignment hole 14 in "bumper" 12 of "clam shell" housing portion 10 and corresponding alignment hole 24 in "bumper" 22 of "clam shell" housing portion 20). In addition, the alignment holes formed in the lead frame 30 are formed in "dead space areas" on the lead frame 30 (e.g., alignment hole 38 in "dead space area" 37 on the lead frame 30). The "dead space areas" on the lead frame 30 are so named, because these are areas on the lead frame 30 that can be severed from the remainder of the lead frame 30 without affecting the functional purposes of the lead frame 30. Examples of areas on the lead frame 30 that affect the functional purposes of the lead frame 30 are a die attach pad 32 upon which the IC being housed is attached, a plurality of leads 36, and conductive traces 34 which electrically connect the IC to the plurality of leads 36. Since the "dead space areas" can be severed from the lead frame 30 without affecting the functional purposes of the lead frame 30, following the joinder of the two "clam shell" housing portions, 20 and 10, each of the "bumpers" can be cut off if desired.

Now referring to FIG. 2B, a thermal plastic seal ring 64 is formed or press-fitted into a groove 62 which has been preformed in a first "clam shell" housing portion 60, and a thermal plastic seal ring 56 is likewise formed or press-fitted into a corresponding groove (not shown) in a second "clam shell" housing portion 50. A lead frame 70 is then positioned against and aligned with the seal ring 64, the second "clam shell" housing portion 50 is positioned against the opposite side of the lead frame 70 and the two "clam shell" housing portions, 60 and 50, are then joined together by ultrasonically welding their respective thermal plastic seal rings, 64 and 54, together with the lead frame 70 sandwiched in-between.

Alignment of the lead frame 70 with respect to the thermal plastic seal ring 64 is achieved by aligning each alignment hole formed on the lead frame 70 with a corresponding alignment hole formed on the thermal plastic seal ring 64 (e.g., alignment hole 78 of the lead frame 70 and alignment hole 66 of the thermal plastic seal ring 64). After each of the alignment holes formed on the lead frame 70 has been aligned with its corresponding alignment hole on the thermal plastic seal ring 64, a pin is inserted in each alignment hole pair (e.g., pin 80 into alignment hole 78 of the lead frame 70 and alignment hole 66 of the thermal plastic seal ring 64) to hold the lead frame 70 in its now aligned position.

Thereupon, the second "clam shell" housing portion 50 is positioned against the opposite side of the lead frame 70, then aligned with the first "clam shell" housing portion 60, and then joined with the first "clam shell" housing portion 60 by ultrasonically welding their respective thermal plastic seal rings, 54 and 64, together. Preferably, alignment of the two "clam shell" housing portions, 60 and 50, is accomplished by aligning and inserting each pin extending out of the previously aligned alignment hole pair of the lead frame 70 and the thermal plastic seal ring 64 of the first "clam shell" housing portion 60, with an alignment hole formed in the seal ring 54 of the second "clam shell" housing portion 50 (e.g., alignment hole 56 formed in thermal plastic seal ring 54 is aligned with pin 80 and pin 80 is inserted therein). Alternatively, alignment of the two "clam shell" housing portions, 60 and 50, can also be accomplished by merely aligning corresponding outer edges of the two housing portions, as the two housing portions are brought together. This type of alignment method would eliminate the need of forming alignment holes (e.g., 56) in the seal ring 54 of the second "clam shell" housing portion 50.

Referring back to the example illustrated in FIG. 2B, the alignment holes formed in the lead frame 70 are formed in tie-bar areas (e.g., alignment hole 78 formed in tie-bar area 77). The tie-bar areas function to mechanically connect a die attach pad 72 upon which the IC is attached, to the remainder of the lead frame 70. Outside of the tie-bar areas are leads (e.g., 76) which extend beyond the packaged unit after the two housing portions, 60 and 50, are joined together, and conductive traces (e.g., 74) which electrically connect the IC to the leads (e.g., 76).

FIG. 2C illustrates, as an example, alternative configurations for the two seal rings 54 and 64 of FIG. 2B. Both seal rings 55 and 65, illustrated in FIG. 2C, have at least two conically shaped weld projections (e.g., 52 on seal ring 55) which also function as alignment pins, and at least two alignment holes (e.g., 63 on seal ring 65) positioned to be adjacent to the at least two conically shaped weld projections of the other seal ring (e.g., 52 on seal ring 55) when the two housing portions holding the two seal rings are brought together for joinder (e.g., as shown in FIG. 2B). Thus, by replacing the seal rings of FIG. 2B with those of FIG. 2C, at least two of the alignment holes of the lead frame 70 will align with and be held in place by the at least two conically shaped weld projections of the bottom seal ring 65, and the top seal ring 55 will be subsequently aligned with the bottom seal ring 65 and lead frame 70 by aligning its at least two conically shaped weld projections with the remaining alignment holes of the lead frame 70 and inserting them into the at least two alignment holes of the bottom seal ring 65.

Figure 3A:
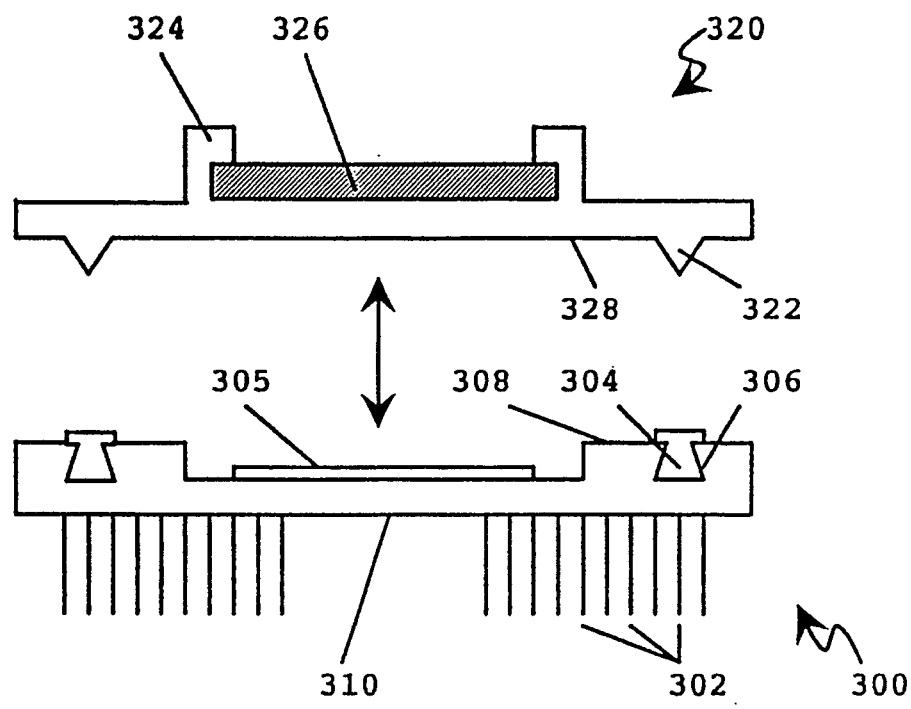
FIGS. 3A-B illustrate, as examples, exploded, cross-sectional views of two different pin-grid-array type packages, utilizing aspects of the present invention.
Figure 3B:
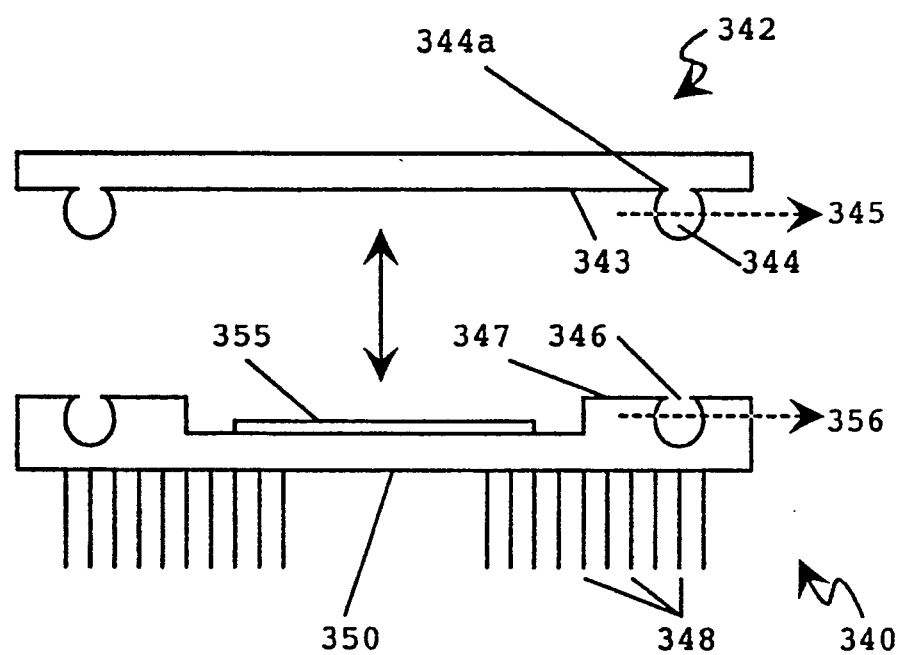

FIGS. 3A–B illustrate, as examples, exploded, cross-sectional views of pin-grid-array ("PGA") type packages, utilizing aspects of the present invention. Referring first to FIG. 3A, a thermal plastic lid 320 is positioned against a PGA package 300 and weld projections 322 formed on a bottom side 328 of the thermal plastic lid 320 are then ultrasonically welded to a thermal plastic seal ring 304 which has been formed or press-fitted into a groove 306 preformed on a top surface 308 of the PGA package 300, to house an IC 305 which was previously attached to the PGA package 300 and electrically connected to pins 302. Optionally, a stiffing plate 326 to provide mechanical rigidity, can be attached to the thermal plastic lid 320 and held in place by holding braces 324.

Subsequent disassembly of the packaged unit can be easily accomplished by exposing the unit to heat (e.g., placing the packaged unit in a fixture and exposing it to a hot plate), while physically pulling the thermal plastic lid 320 off of the PGA package 300, or using a knife, for example, to cut the thermal plastic joint area formed between the thermal plastic lid 320 and the PGA package 300, or a combination of heating and cutting. If desired, subsequent reassembly of the packaged unit can then be accomplished by first shaving the top surface of the thermal plastic seal ring 304 with a knife, for example, then ultrasonically welding a new thermal plastic lid onto the old PGA package 300, or repairing the weld projections 322 on the old thermal plastic lid 320 and ultrasonically re-welding the thus repaired thermal plastic lid 320 onto the PGA package 300.

In FIG. 3B, a lid 342 is positioned against a PGA package 340 and lock pins 344 formed on a bottom surface 343 of the lid 342 are then press-fitted into corresponding lock recepticles 346 formed on a top surface 347 of the PGA package 340, to house an IC 355 which was previously attached to the PGA package 340 and electrically connected to pins 348. In order to mechanically interlock, the lock pin 344 is preferably formed of an elastic material with good rigidity qualities, such as a thermal plastic material. Similar to the cavity and protrusion shapes as described in reference to FIGS. 1E and 1F, the cross-sectional shape of the lock recepticle 346 is preferably such that the opening width of the cavity as measured across the top surface 347 of the PGA package 340, is less than at least one internal cross-sectional width such as one measured across a line 356 which is parallel to the top surface 347 of the PGA package 340, and the shape of the lock pin 344 is preferably such that the width of its neck 344a as measured across the bottom surface 343 of the lid 342, is less than at least one cross-sectional width such as one measured across a line 345 which is parallel to the bottom surface 343 of the lid 342 and which is away from the neck 344a.

Although the various aspects of the present invention have been described with respect to a preferred and several alternative embodiments, it will be understood that the invention is entitled to full protection within the full scope of the appended claims. In particular, although the preferred and alternative embodiments described herein illustrate packages for housing a single integrated circuit, the full scope of the appended claims should not be so limited, since the structures and methods described herein are equally applicable to the packaging of multichip modules.

What is claimed is:

1. A method for housing an integrated circuit comprising the steps of:
    forming first and second housing portions adapted to be joined together to house said integrated circuit;
    forming a groove having serrated walls in said first housing portion;
    insert molding a thermal plastic material into said groove of said first housing portion to form a thermal plastic joint area therein;
    forming a thermal plastic joint area on said second housing portion; and
    bringing said first and second housing portions together, and joining them together by ultrasonically welding together said thermal plastic joint areas of said first and second housing portions.

2. The method for housing an integrated circuit as recited in claim 1, wherein said insert molding step further comprises the step of forming a weld projection on said thermal plastic joint area of said first housing portion.

3. The method for housing an integrated circuit as recited in claim 1, further comprising, before said bringing and joining together step, the steps of:
    forming at least two alignment holes on said first housing portion;
    forming a lead frame having at least two alignment holes; and
    positioning and holding said lead frame against said first housing portion such that each of said at least two alignment holes of said lead frame are adjacent to one of said at least two alignment holes of said first housing portion.

4. The method for housing an integrated circuit as recited in claim 1, further comprising, before said bringing and joining together step, the steps of:
    forming at least two alignment holes in said second housing portion;
    forming a lead frame having at least two alignment holes; and
    positioning and holding said lead frame against said second housing portion such that each of said at least two alignment holes of said lead frame are adjacent to one of said at least two alignment holes of said second housing portion.

5. A method for housing an integrated circuit comprising the steps of:
    forming first and second housing portions adapted to be joined together to house said integrated circuit;
    forming a groove in said first housing portion;
    press-fitting a seal ring comprising a thermal plastic material into said groove formed in said first housing portion to form a thermal plastic joint area therein; forming a thermal plastic joint area on said second housing portion; and
    bringing said first and second housing portions together, and joining them together by ultrasonically welding together said thermal plastic joint areas of said first and second housing portions.

6. The method for housing an integrated circuit as recited in claim 5, further comprising, before said bringing and joining together step, the steps of:
    forming at least two alignment holes in said first housing portion;
    forming a lead frame having at least two alignment holes;
    positioning and holding said lead frame against said first housing portion such that each of said at least two alignment holes of said lead frame are adjacent to one of said at least two alignment holes of said first housing portion.

7. The method for housing an integrated circuit as recited in claim 5, further comprising, before said bringing and joining together step, the steps of:
    forming at least two alignment holes in said second housing portion;
    forming a lead frame having at least two alignment holes;
    positioning and holding said lead frame against said second housing portion such that each of said at least two alignment holes of said lead frame are adjacent to one of said at least two alignment holes of said second housing portion.

8. A method for housing an integrated circuit comprising the steps of:
    forming, from non-thermal plastic material, first and second housing portions adapted to be joined together to house said integrated circuit;
    forming a groove having serrated walls in said first housing portion;
    insert molding a thermal plastic material into said groove of said first housing portion to form a thermal plastic joint area therein;
    forming a thermal plastic joint area on said second housing portion; and
    bringing said first and second housing portions together, and joining them together by ultrasonically welding together said thermal plastic joint areas of said first and second housing portions.

9. The method for housing an integrated circuit as recited in claim 8, wherein said insert molding step further comprises the step of forming a weld projection on said thermal plastic joint area of said first housing portion.

10. The method for housing an integrated circuit as recited in claim 8, further comprising, before said bringing and joining together step, the steps of:
    forming at least two alignment holes on said first housing portion;
    forming a lead frame having at least two alignment holes; and
    positioning and holding said lead frame against said first housing portion such that each of said at least two alignment holes of said lead frame are adjacent to one of said at least two alignment holes of said first housing portion.

11. The method for housing an integrated circuit as recited in claim 8, further comprising, before said bringing and joining together step, the steps of:
    forming at least two alignment holes in said second housing portion;
    forming a lead frame having at least two alignment holes; and positioning and holding said lead frame against said second housing portion such that each of said at least two alignment holes of said lead frame are adjacent to one of said at least two alignment holes of said second housing portion.

12. A method for housing an integrated circuit comprising the steps of:

forming, from non-thermal plastic material, first and second housing portions adapted to be joined together to house said integrated circuit;

forming a groove in said first housing portion;

press-fitting a seal ring comprising a thermal plastic material into said groove formed in said first housing portion to form a thermal plastic joint area therein;

forming a thermal plastic joint area on said second housing portion; and bringing said first and second housing portions together, and joining them together by ultrasonically welding together said thermal plastic joint areas of said first and second housing portions.

13. The method for housing an integrated circuit as recited in claim 12, further comprising, before said bringing and joining together step, the steps of:

forming at least two alignment holes in said first housing portion;

forming a lead frame having at least two alignment holes;

positioning and holding said lead frame against said first housing portion such that each of said at least two alignment holes of said lead frame are adjacent to one of said at least two alignment holes of said first housing portion.

14. The method for housing an integrated circuit as recited in claim 12, further comprising, before said bringing and joining together step, the steps of:

forming at least two alignment holes in said second housing portion;

forming a lead frame having at least two alignment holes;

positioning and holding said lead frame against said second housing portion such that each of said at least two alignment holes of said lead frame are adjacent to one of said at least two alignment holes of said second housing portion.

15. A method for housing an integrated circuit comprising the steps of:

forming first and second housing portions adapted to be joined together to house said integrated circuit;

forming a layer of graphite particles on a surface of said first housing portion;

forming a thermal plastic joint area on said second housing portion; and bringing said first and second housing portions together, and joining them together by ultrasonically welding together said thermal plastic joint area of said second housing portion to said layer of graphite particles on said surface of said first housing portion.

16. The method for housing an integrated circuit as recited in claim 15, wherein said thermal plastic joint area forming step comprises the steps of:

forming a groove having serrated walls in said second housing portion; and insert molding a thermal plastic material into said groove of said second housing portion to form a thermal plastic joint area therein.

17. The method for housing an integrated circuit as recited in claim 15, wherein said thermal plastic joint area forming step comprises the steps of:

forming a groove in said second housing portion; and press-fitting a seal ring comprising a thermal plastic material into said groove formed in said second housing portion to form a thermal plastic joint area therein.

18. The method for housing an integrated circuit as recited in claim 15, wherein said thermal plastic joint area forming step further comprises the step of forming a weld projection on said thermal plastic joint area of said second housing portion.

19. The method for housing an integrated circuit as recited in claim 15, wherein said first and second housing portions forming step includes the step of forming a first housing portion from a metallic material.

20. The method for housing an integrated circuit as recited in claim 15, wherein said first and second housing portions forming step includes the step of forming a first housing portion from a ceramic material.

* * * * *